United States Patent
Hu et al.

(10) Patent No.: US 11,765,919 B2
(45) Date of Patent: Sep. 19, 2023

(54) DISPLAY PANEL

(71) Applicant: AU Optronics Corporation, Hsin-Chu (TW)

(72) Inventors: Shuo-Hsiu Hu, Hsin-Chu (TW); Hsi-An Chen, Hsin-Chu (TW); Hung-Hsiu Yen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/703,470

(22) Filed: Mar. 24, 2022

(65) Prior Publication Data

US 2022/0216446 A1   Jul. 7, 2022

Related U.S. Application Data

(62) Division of application No. 16/692,168, filed on Nov. 22, 2019, now Pat. No. 11,316,123.

(30) Foreign Application Priority Data

Mar. 21, 2019 (TW) .................. 108109847

(51) Int. Cl.
*H10K 50/125* (2023.01)
*H10K 59/122* (2023.01)
(Continued)

(52) U.S. Cl.
CPC ......... *H10K 50/125* (2023.02); *H10K 59/122* (2023.02); *H10K 71/00* (2023.02);
(Continued)

(58) Field of Classification Search
None
See application file for complete search history.

(56) References Cited

U.S. PATENT DOCUMENTS 7,969,535 B2   6/2011  Chiu
2003/0222861 A1  12/2003  Nishikawa et al.
(Continued)

FOREIGN PATENT DOCUMENTS

CN   104064584     9/2014
CN   107819020 A   3/2018
(Continued)

OTHER PUBLICATIONS

Berry, Steve, "Screens just became non-rectangular", http://www.thoughtmerchants.com/work/screen-just-became-non-rectangular, Sep. 18, 2017 (Year: 2017).
(Continued)

*Primary Examiner* — Vincent Wall
(74) *Attorney, Agent, or Firm* — WPAT, P.C

(57) ABSTRACT

An embodiment of the present disclosure provides a display panel having a non-rectangular display region. The display panel includes a substrate, a pixel definition layer, a first organic material layer, and a second organic material layer. The pixel definition layer is disposed on the substrate, and defines a first pixel area and a second pixel area on the substrate. The first organic material layer is disposed in the first pixel area and has a first light-emitting region. The second organic material layer is disposed in the second pixel area and has a second light-emitting region. The first organic material layer and the second organic material layer have the same material and the same vertical projection area on the substrate, and the vertical projection area of the first light-emitting region on the substrate is smaller than the vertical projection area of the second light-emitting region on the substrate.

17 Claims, 9 Drawing Sheets

(51) Int. Cl.
*H10K 71/00* (2023.01)
*H10K 71/40* (2023.01)
*H10K 77/10* (2023.01)
*H10K 59/12* (2023.01)

(52) U.S. Cl.
CPC ............. *H10K 71/40* (2023.02); *H10K 77/10* (2023.02); *H10K 59/1201* (2023.02)

(56) References Cited

U.S. PATENT DOCUMENTS

| | | |
|---|---|---|
| 2005/0242710 A1 | 11/2005 | Yamazaki et al. |
| 2007/0109468 A1 | 5/2007 | Oku |
| 2009/0195481 A1* | 8/2009 | Taguchi ................. G02B 5/205 |
| | | 345/55 |
| 2009/0213307 A1 | 8/2009 | Chiu et al. |
| 2010/0291720 A1 | 11/2010 | Kim |
| 2011/0193477 A1 | 8/2011 | Lifka |
| 2011/0212393 A1 | 9/2011 | Chiu et al. |
| 2012/0097926 A1* | 4/2012 | Park ..................... H01L 51/0013 |
| | | 257/40 |
| 2014/0117339 A1* | 5/2014 | Seo ..................... H01L 27/3216 |
| | | 257/89 |

FOREIGN PATENT DOCUMENTS

| | | | |
|---|---|---|---|
| CN | 107887418 A * | 4/2018 | ......... H01L 27/3216 |
| CN | 107887418 A | 4/2018 | |
| TW | 200937075 A | 9/2009 | |

OTHER PUBLICATIONS

Giraudet et al., "Threshold voltage and turn-on voltage in organic transistors: Sensitivity to contact parasitics", Organic Electronics 12 (2011) 219-225 (Year: 2011).

* cited by examiner

DISPLAY PANEL

CROSS-REFERENCE TO RELATED APPLICATION

The present application is a Divisional Application of the U.S. application Ser. No. 16/692,168, filed Nov. 22, 2019, which claims priority to Taiwan Application Serial Number 108109847, filed Mar. 21, 2019, all of which are herein incorporated by reference in their entireties.

BACKGROUND

Field of Invention

The present disclosure relates to a display panel.

Description of Related Art

With the development of technology, light-emitting diodes have become common and widely used in commercial applications. Light-emitting diodes have many advantages, such as low energy consumption and fast switching. Therefore, conventional light-emitting elements have gradually been replaced by light-emitting diode light sources. Light-emitting diode technology has also begun to develop in display technology. For example, display technology for forming a light-emitting diode and using the light-emitting diode as a pixel has been developed in recent years.

To this, in response to the development of organic light-emitting diodes, organic light-emitting diodes have been further applied to display technology. The display device using the organic light-emitting diode may display images without the backlight module, so that the display device may display a better quality black image, and may also be designed to be thinner and lighter. In view of this, the issues related to the display device applying the organic light-emitting diode have become one of the research and development directions in the current related fields.

SUMMARY

An embodiment of the present disclosure provides a display panel having a non-rectangular display region. The display panel includes a substrate, a pixel definition layer, a first organic material layer, and a second organic material layer. The pixel definition layer is disposed on the substrate, and defines a first pixel area and a second pixel area on the substrate. The first organic material layer is disposed in the first pixel area and has a first light-emitting region. The second organic material layer is disposed in the second pixel area and has a second light-emitting region. The first organic material layer and the second organic material layer have the same material and the same vertical projection area on the substrate, and the vertical projection area of the first light-emitting region on the substrate is smaller than the vertical projection area of the second light-emitting region on the substrate.

With the above configuration, the organic material layer having the first portion and the second portion may be used to define the boundary of the display region. In the case where the interface between the first portion and the second portion is a curved surface or an arc surface, the display region may be made to be a non-rectangular pattern. That is, the display panel may present a non-rectangular display region without using additional shields.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
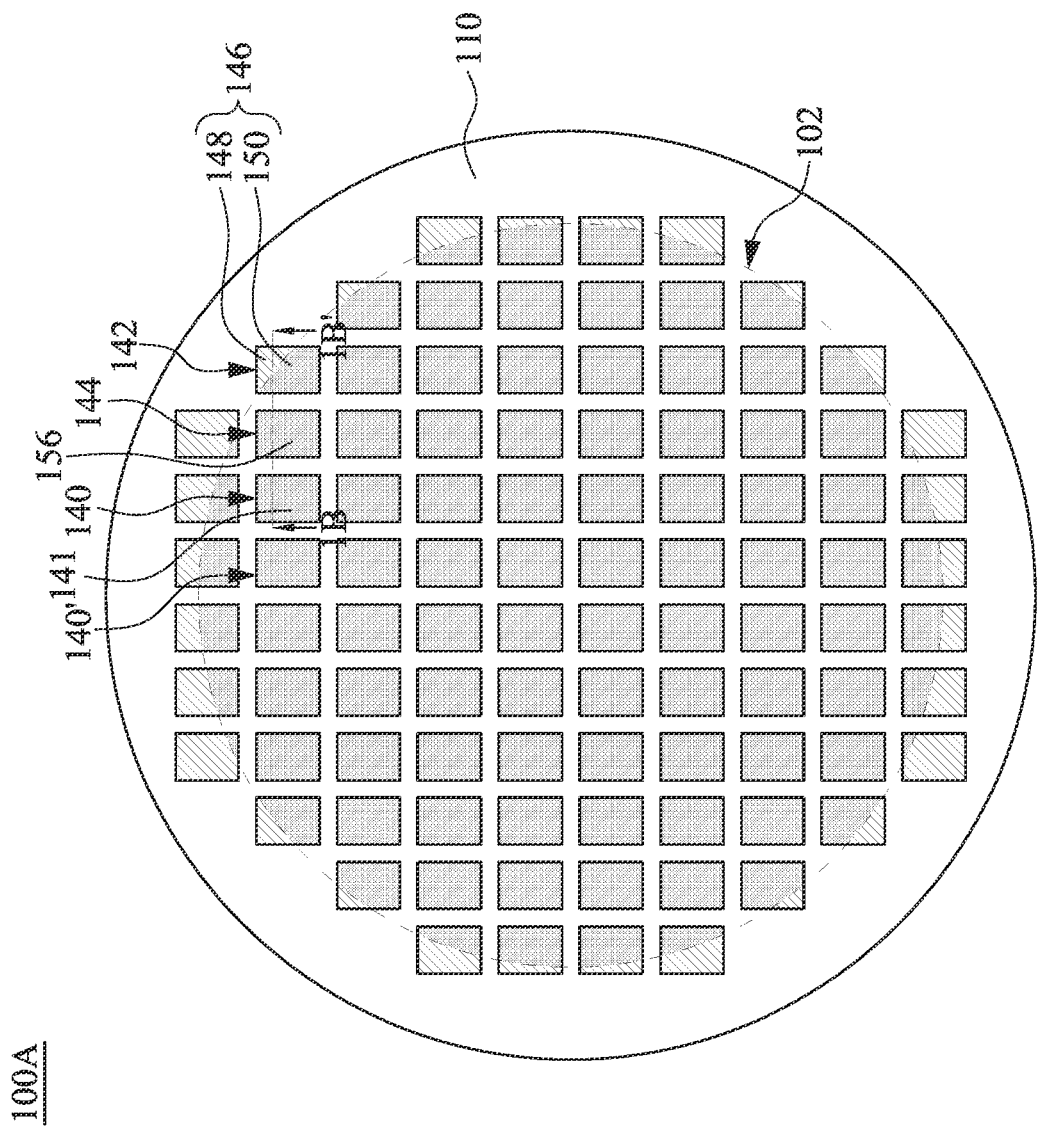
FIG. 1A is a schematic top view showing a display panel according to a first embodiment of the present disclosure.

The embodiments of the present disclosure are disclosed in the following drawings, and for the sake of clarity, the practical details are also discussed in the following description. However, it should be understood that these practical details are not intended to limit the present disclosure. That is, in some embodiments of the present disclosure, these practical details are not necessary. In addition, some of the conventional structures and elements are shown in the drawings in a simplified schematic manner in order to simplify the drawings.

The words "first," "second," "third," etc. are used herein to describe various elements, components, regions, and layers. However, these elements, components, regions, and layers should not be limited by these terms. These terms are used to identify a single element, component, region, or layer. Thus, a singular element, component, region, or layer may be hereinafter referred to as a second element, component, region, layer, without departing from the spirit of the present disclosure.

As used herein, "about," "approximately" or "substantially" includes the values and average values within acceptable ranges of the particular value determined by one of ordinary skill in the art, in view of the discussion, considering the measurement and the specific number of errors associated with the measurement (i.e., the limits of the measurement system). For example, "about" or "substantially" may mean within one or more standard deviations of the value, such as within ±30%, ±20%, ±10%, ±5%.

The display panel of the present disclosure may form a display region by using light-emitting elements, wherein the organic light-emitting element may provide a non-rectangular display region after the modification process, wherein the "non-rectangular" may be an ellipse, a triangle, a polygon with four or more edges.

Figure 1B:
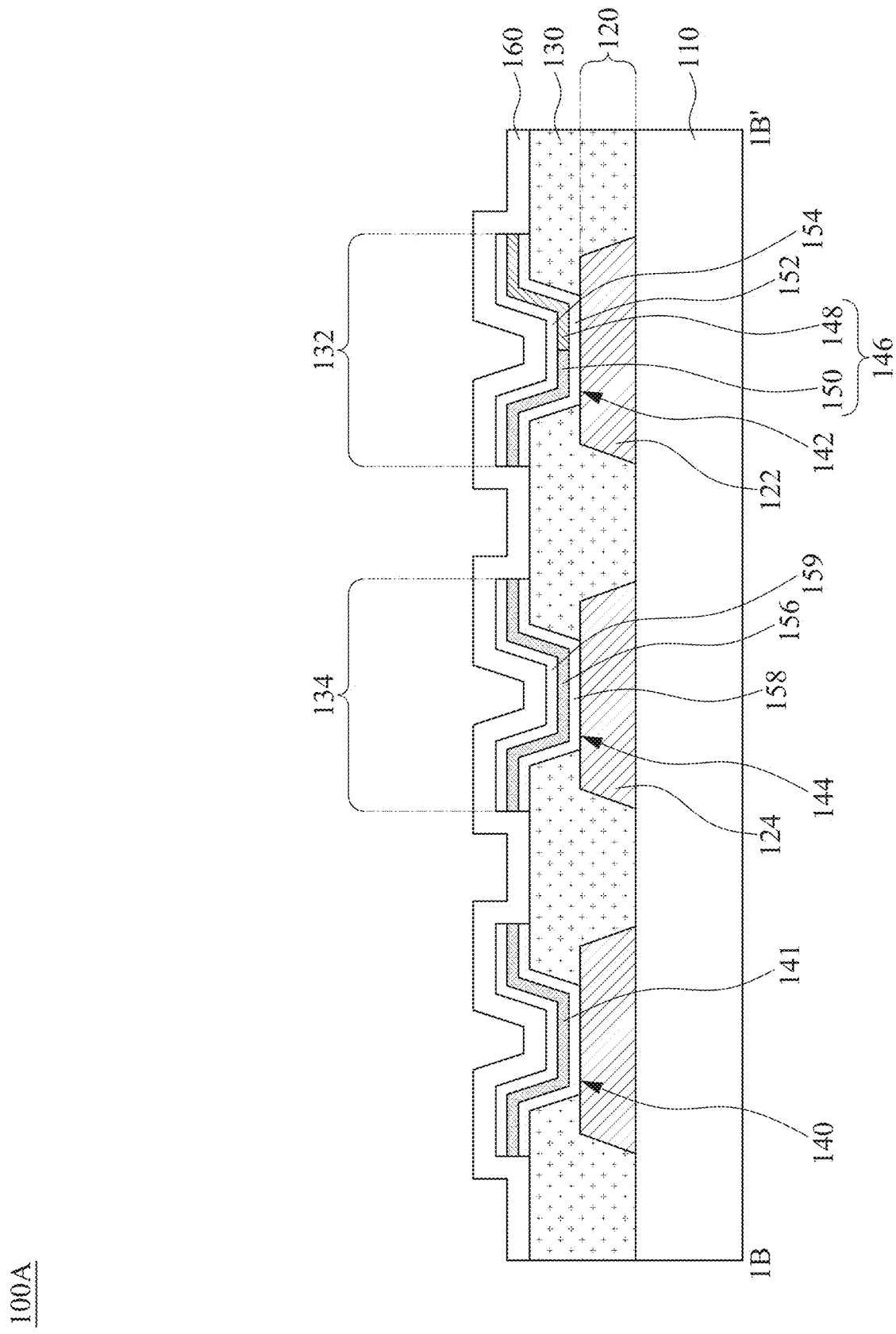
FIG. 1B is a schematic cross-sectional view of the line segment 1B-1B' of FIG. 1A.

Refer to FIGS. 1A and 1B, FIG. 1A is a schematic top view showing a display panel 100A according to a first embodiment of the present disclosure, and FIG. 1B is a schematic cross-sectional view of the line segment 1B-1B' of FIG. 1A. The display panel 100A includes a substrate 110, a first electrode layer 120, a pixel definition layer 130, a plurality of light-emitting elements 140, and a second electrode layer 160. In some embodiments, the substrate 110 may be a thin film transistor array substrate, and the thin film transistor array substrate may have a thin film transistor array configured by a plurality of thin film transistors. The thin film transistor may be used as a switching element in the display panel 100A. In some other embodiments, the substrate 110 may be a circuit layer substrate, and the circuit layer substrate may have lines electrically connected to the driving element.

The first electrode layer 120 is disposed on the substrate 110, and the first electrode layer 120 may include a plurality of blocks, such as the first block 122 and the second block 124. The first block 122 and the second block 124 may be separated from each other, such that the first block 122 and the second block 124 may be respectively applied with different voltages. In some embodiments, the first block 122 and the second block 124 of the first electrode layer 120 may be electrically connected to different thin film transistors, so that the act of applying a voltage to the first block 122 may be independent to the act of applying a voltage to the second block 124. In some embodiments, the first block 122 and the second block 124 of the first electrode layer 120 may be electrically connected to different lines, so that the act of applying a voltage to the first block 122 is still independent to the act of applying a voltage to the second block 124. The plurality of blocks of the first electrode layer 120 may be formed by patterning the same conductive layer, where the conductive layer may include a metal material such as aluminum, molybdenum, silver, or combinations thereof.

The pixel definition layer 130 is disposed on the substrate 110 and partially covers the first electrode layer 120. The pixel definition layer 130 may be located between the plurality of blocks of the first electrode layer 120. For example, the pixel definition layer 130 may be located between the first block 122 and the second block 124 of the first electrode layer 120, such that the first block 122 and the second block 124 are separated by the pixel definition layer 130. The pixel definition layer 130 may define a plurality of pixel regions on the substrate 110, such as the first pixel region 132 and the second pixel region 134 of FIG. 1B. Each pixel region may correspond to a different block of the first electrode layer 120. For example, the vertical projections of the first pixel region 132 and the second pixel region 134 on the substrate 110 overlap the first block 122 and the second block 124 of the first electrode layer 120, respectively. The material of the pixel definition layer 130 may be an organic material or an inorganic material, such as epoxy resin, yttrium oxide (SiOx), tantalum nitride (SiNx), a composite layer composed of yttrium oxide and tantalum nitride, or other suitable dielectric material.

The plurality of light-emitting elements 140 are respectively disposed on different blocks of the first electrode layer 120, such that the first electrode layer 120 may serve as a driving electrode of the light-emitting element 140. The plurality of light-emitting elements 140 are respectively located in different pixel regions. Each light-emitting element 140 includes an organic material layer 141, and the plurality of light-emitting elements 140 may be configured in an array form. The organic material layer 141 of the light-emitting element 140 is biased to form a light-emitting region, and the light-emitting regions may collectively serve as the display region 102 of the display panel 100A. That is, the plurality of light-emitting elements 140 may be used as light-emitting pixels, and the display region 102 is formed by aggregating, and the boundary contour of the organic material layer 141 of the light-emitting element 140 coincides with the boundary contour of the display region 102.

The second electrode layer 160 is disposed on the pixel definition layer 130 and covers the plurality of light-emitting elements 140 to serve as a common electrode. The second electrode layer 160 may include a transparent conductive material, such as indium tin oxide, indium zinc oxide, zinc oxide, indium gallium zinc oxide or other suitable materials.

To facilitate understanding, the light-emitting element 140 in FIG. 1A is shown to have the same mesh bottom as the organic material layer 141 of FIG. 1B. In addition, for convenience of explanation, the following description will be made with the first light-emitting element 142 and the second light-emitting element 144 in the light-emitting element 140. The structural description of the first light-emitting element 142 or the second light-emitting element 144 may be applied to other corresponding light-emitting elements 140. Further, the plurality of light-emitting elements 140 may respectively provide different color lights in accordance with the arrangement order. For example, the first light-emitting element 142 of FIG. 1A may provide red color light, the second light-emitting element 144 of FIG. 1A may provide green color light, and then, from the light-emitting element 140 of FIG. 1A, along the left direction, the color lights provided by the plurality of light-emitting elements 140 may be blue, red, and green in order, and are repeatedly arranged according to this rule. That is, in the lateral direction, the light-emitting elements 140 may be periodically arranged in a group of three colors (blue, red, green). In the longitudinal direction, the light-emitting element 140 may be a color light that provides the same color.

The first light-emitting element 142 is located within the first pixel region 132 and may serve as a pixel on the boundary of the display region 102, that is, the first light-emitting element 142 is located at the edge of the display region 102. The first light-emitting element 142 is disposed between the first block 122 of the first electrode layer 120 and the second electrode layer 160 and contacts the first block 122 of the first electrode layer 120 and the second electrode layer 160. When the first block 122 of the first electrode layer 120 is applied with a voltage by the substrate 110, the first light-emitting element 142 may generate electroluminescence by the bias voltage generated by the first block 122 of the first electrode layer 120 and the second electrode layer 160.

In some embodiments, the first light-emitting element 142 may be a multi-layered structure. For example, the first light-emitting element 142 may include a first carrier transport layer 152, a first organic material layer 146, and a second carrier transport layer 154 that are sequentially stacked from the first block 122 of the first electrode layer 120. When the first electrode layer 120 and the second electrode layer 160 are respectively an anode and a cathode, the first carrier transport layer 152 and the second carrier transport layer 154 may respectively be a hole transport layer and an electron transport layer. The present disclosure is not limited thereto. Although the first light-emitting element 142 of FIG. 1B is illustrated as a three-layer structure, in some other embodiments, the first light-emitting element 142 may further include at least one layer of a carrier barrier layer, at least one layer of carrier injection layer, or combinations thereof.

The first organic material layer 146 of the first light-emitting element 142 includes a first portion 148 and a second portion 150 that are connected to each other. The first portion 148 and the second portion 150 may be formed of the same organic layer body, and then the first portion 148 may be modified so that the material properties of the first portion 148 are different from the material properties of the second portion 150. The material properties include a minimum turn-on voltage, energy gap, impedance, and/or carrier mobility. In some embodiments, the minimum turn-on voltage of the first portion 148 is different from the minimum turn-on voltage of the second portion 150, and the ratio of the minimum turn-on voltage of the first portion 148 to the minimum turn-on voltage of the second portion 150 is between 2 and 7. In some embodiments, the energy gap of the first portion 148 may be different from the energy gap of the second portion 150. For example, the energy gap of the first portion 148 may be substantially different from the energy gap of the second portion 150 by 0.8 eV to 1.2 eV. In some embodiments, the impedance of the first portion 148 may be different from the impedance of the second portion 150. For example, the ratio of the impedance of the first portion 148 to the impedance of the second portion 150 may be between 8 and 12. In some embodiments, the carrier mobility of the first portion 148 may be different from the carrier mobility of the second portion 150. For example, the ratio of the carrier mobility of the first portion 148 to the carrier mobility of the second portion 150 may be between 8 and 12.

On the other hand, since the first portion 148 and the second portion 150 of the first organic material layer 146 are formed of the same organic layer body, the first portion 148 and the second portion 150 of the first organic material layer 146 may have substantially the same kind of organic molecules. In some embodiments, the modified first portion 148 and the second portion 150 may have the same kind of organic light-emitting material. In some other embodiments, the second portion 150 can have an organic light-emitting material, while the modified first portion 148 has a derivative of the organic light-emitting material of the second portion 150. For example, the first portion 148 and the second portion 150 may be formed of the same organic polymer layer body. After modifying the first portion 148, the organic light-emitting materials of the first portion 148 and the second portion 150 may have the same main chain, while the organic light-emitting materials of the first portion 148 and the second portion 150 have distinct branch chains. In addition, since the first portion 148 and the second portion 150 are formed of the same organic layer body, the first portion 148 and the second portion 150 may have substantially the same thickness.

The bias voltage generated by the first block 122 of the first electrode layer 120 and the second electrode layer 160 may generate illumination by the electron-hole recombination mechanism in the first organic material layer 146 of the first light-emitting element 142. Since the material properties of the first portion 148 and the second portion 150 are different, the brightness of the first portion 148 may be different from the brightness of the second portion 150 when a bias voltage is applied to the first light-emitting element 142. For example, under the bias voltage of the first light-emitting element 142, the illuminating brightness of the first portion 148 may be less than the illuminating brightness of the second portion 150. More specifically, when the bias voltage applied to the first light-emitting element 142 may cause the second portion 150 to illuminate and may not cause the first portion 148 to illuminate, the illuminance of the first portion 148 approaches zero.

Since the second portion 150 may emit light and the first portion 148 cannot emit light when the first organic material layer 146 is biased, the boundary of the display region 102 can be defined by the first organic material layer 146. That is, the interface between the first portion 148 and the second portion 150 of the first organic material layer 146 is the boundary of the display region 102. In some embodiments, the interface between the first portion 148 and the second portion 150 of the first organic material layer 146 in the direction perpendicular to the substrate 110 is a curved surface or an arc surface. Therefore, the display panel 100A can present a curved or arc display region 102 without using an additional shield.

The second light-emitting element 144 is located within the second pixel region 134 and may serve as a pixel on the boundary of the display region 102, that is, the second light-emitting element 144 is located distant from the edge of the display region 102 with respect to the first light-emitting element 142. The second light-emitting element 144 is disposed between the second block 124 of the first electrode layer 120 and the second electrode layer 160 and contacts the second block 124 of the first electrode layer 120 and the second electrode layer 160. When the second block 124 of the first electrode layer 120 is applied with a voltage by the substrate 110, the second light-emitting element 144 may generate electroluminescence by the bias voltage generated by the second block 124 of the first electrode layer 120 and the second electrode layer 160. Since the act of applying a voltage to the first block 122 may be independent of the act of applying a voltage to the second block 124, the illumination intensity of the first light-emitting element 142 and the illumination intensity of the second light-emitting element 144 may be independently controlled by the first block 122 and the second block 124 of the first electrode layer 120.

In some embodiments, the second light-emitting element 144 may be a multi-layered structure, and the number of layers thereof may be the same as that of the first light-emitting element 142. For example, the second light-emitting element 144 may include a third carrier transport layer 158, a second organic material layer 156, and a fourth carrier transport layer 159 that are sequentially stacked from the second block 124 of the first electrode layer 120. When the first electrode layer 120 and the second electrode layer 160 are respectively an anode and a cathode, the third carrier transport layer 158 and the fourth carrier transport layer 159 may respectively be a hole transport layer and an electron transport layer. Similarly, the present disclosure is not limited thereto, although the second light-emitting element 144 of FIG. 1B is illustrated as a three-layer structure, in some other embodiments, the second light-emitting element 144 may further include at least one layer of a carrier barrier layer, at least one layer of carrier injection layer, or combinations thereof.

The layer body of the first light-emitting element 142 and the second light-emitting element 144 having the same function (for example, lifting the carrier transmission benefit) may be formed by the same process and formed of the same material. For example, the first carrier transport layer 152 of the first light-emitting element 142 and the third carrier transport layer 158 of the second light-emitting element 144 may be formed by the same process and formed of the same material, and thus have substantially the same thickness. Similarly, the second carrier transport layer 154 of the first light-emitting element 142 and the fourth carrier transport layer 159 of the second light-emitting element 144 may be formed by the same process and formed of the same material, and thus have substantially the same thickness.

In addition, the first organic material layer 146 and the second organic material layer 156 may have the same distribution area, but have different illumination region areas. Further, under the bias voltage, since the first portion 148 of the first organic material layer 146 cannot emit light as the second portion 150, the area of the light-emitting region of the second organic material layer 156 (hereinafter referred to as the second light-emitting region) will be larger than the area of the light-emitting region of the first organic material layer 146 (hereinafter referred to as the first light-emitting region). That is, although the vertical projection areas of the first organic material layer 146 and the second organic material layer 156 on the substrate 110 are substantially the same, but the vertical projection area of the first light-emitting region of the first organic material layer 146 on the substrate 110 is smaller than that of the second light-emitting region of the second organic material layer 156, such that the first light-emitting element 142 including the first organic material layer 146 is suitable to be a pixel on the boundary of the display region 102, and the second light-emitting element 142 including the second organic material layer 156 is suitable to be a pixel within the boundaries of the display region 102. That is, a vertical projection position of the first organic material layer 146 on the substrate 110 is adjacent to an edge of the substrate 110 with respect to a vertical projection position of the second organic material layer 156 on the substrate 110.

On the other hand, as illustrated in FIG. 1A, the first light-emitting element 142 and the light-emitting element 140' may have the same properties by including the same material (for example, the same organic light-emitting material, and the formed thicknesses of the organic light-emitting materials are also substantially the same), and therefore are used to provide the same color light, for example, to provide red light. For the first light-emitting element 142 and the light-emitting element 140', the first light-emitting element 142 is located at an edge of the display region 102, and the light-emitting element 140' is located distant from the edge of the display region 102 with respect to the first light-emitting element 142, and the light-emitting region of the light-emitting element 142 is smaller than that of the light-emitting element 140 due to the presence of the first portion 148 that cannot emit light. In some embodiments, a ratio of an illuminating area of the first light-emitting pixel to an illuminating area of the second light-emitting pixel is greater than 0 and less than or equal to 0.95.

Figure 2A:
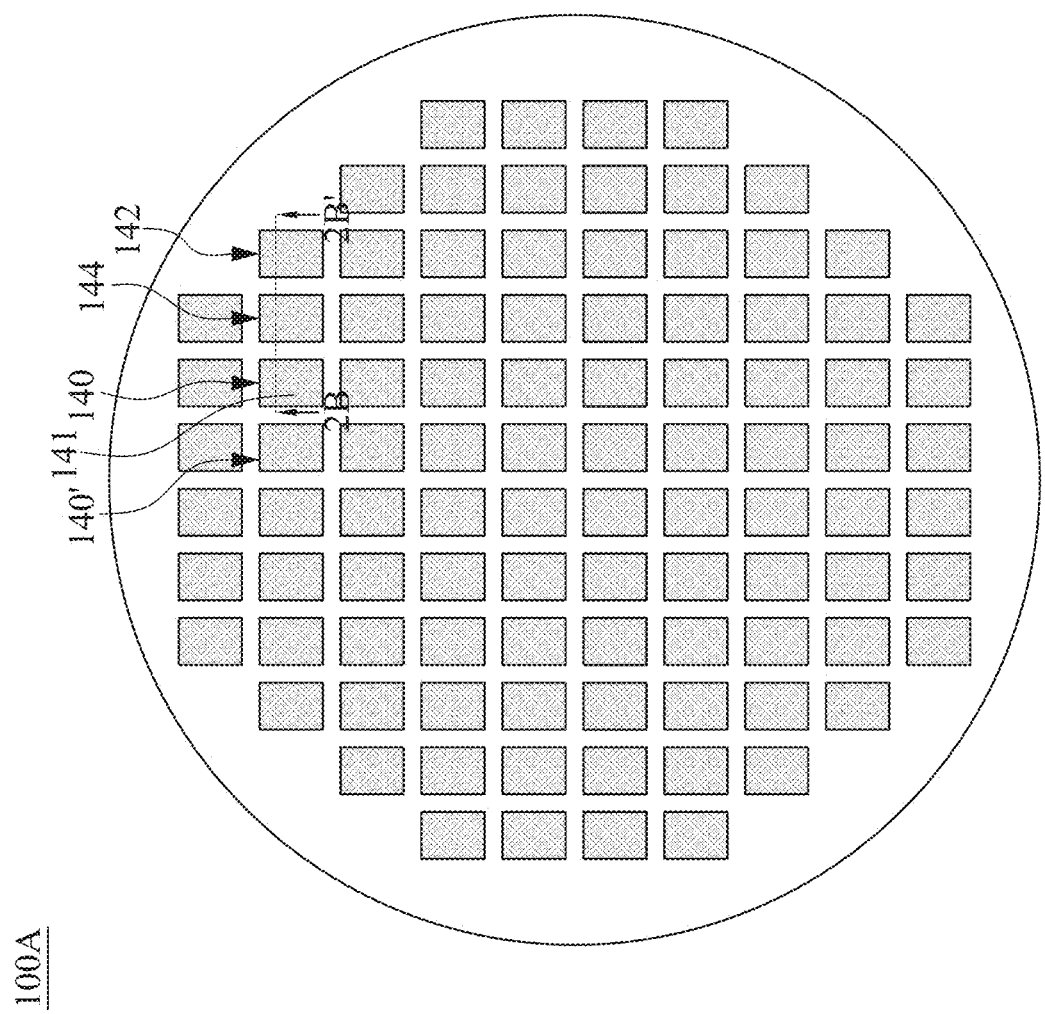
FIG. 2A is a top view showing the manufacturing method of the display panel in the manufacturing stage according to the first embodiment of the present disclosure.
Figure 2B:
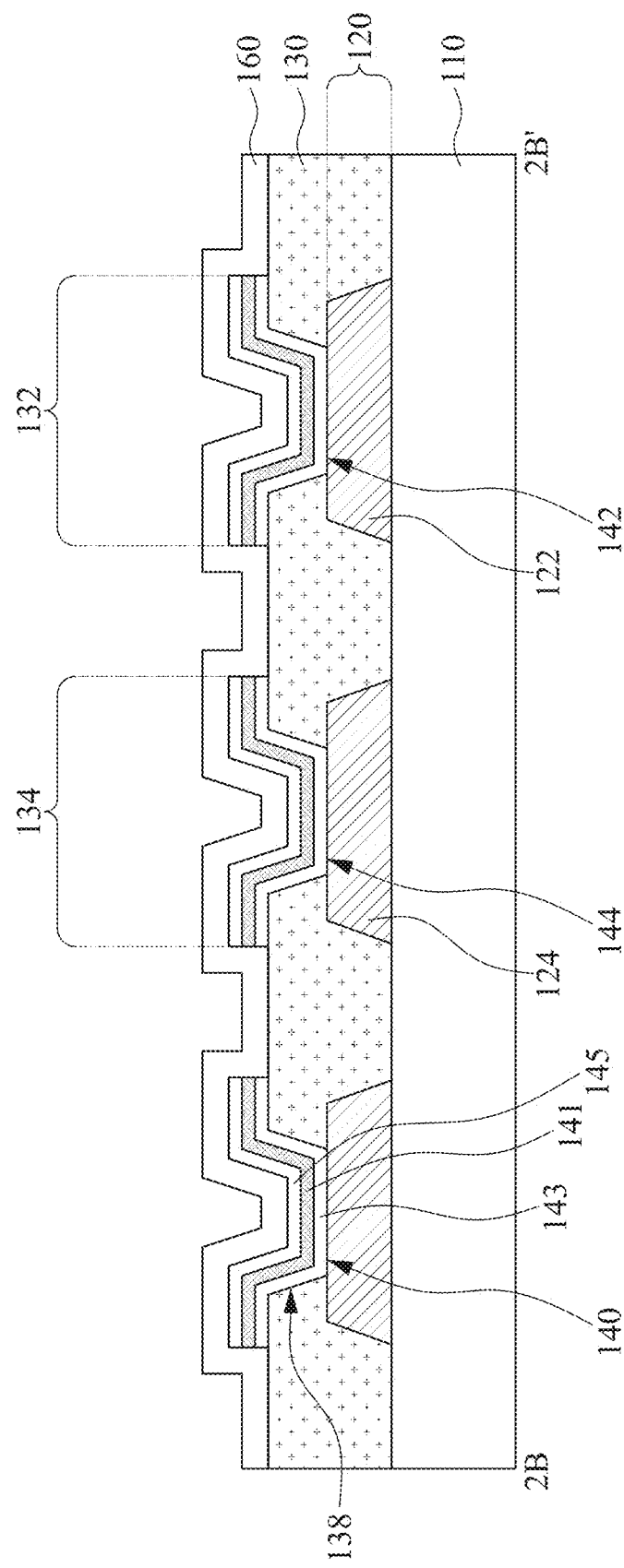
FIG. 2B is a schematic cross-sectional view of the line segment 2B-2B' of FIG. 2A.

The method of manufacturing the display panel 100A and the steps of performing the modification process will be described below. Refer to FIGS. 2A and 2B, FIG. 2A is a top view showing the manufacturing method of the display panel 100A in the manufacturing stage according to the first embodiment of the present disclosure, and FIG. 2B is a schematic cross-sectional view of the line segment 2B-2B' of FIG. 2A. As shown in FIGS. 2A and 2B, the first electrode layer 120 may be formed on the substrate 110, and the first electrode layer 120 may be patterned into a plurality of blocks, such as the first block 122 and the second block 124. The pixel definition layer 130 may be formed on the substrate 110 and partially covers the first electrode layer 120. The formed pixel definition layer 130 may have a plurality of openings 138 to define a plurality of pixel regions, such as a first pixel region 132 and a second pixel region 134.

Next, a plurality of light-emitting elements 140, such as a first light-emitting element 142 and a second light-emitting element 144, may be formed in the plurality of openings 138 of the pixel definition layer 130, respectively. In this stage of fabrication, the structures of the different light-emitting elements 140 may be similar or even identical to each other, for example, each of the light-emitting elements 140 includes an organic material layer 141 and two carrier transport layers 143 and 145. Further, for the light-emitting element 140 that provides the same-color light (for example, red), for example, the first light-emitting element 142 and the light-emitting element 140' of FIG. 2A, in addition to the identical three-layer structure, even the material and thickness of the corresponding layer bodies (for example, the organic material layer or the carrier transport layer included in each of the first light-emitting element 142 and the light-emitting element 140') are also substantially the same. In some embodiments, the material and thickness of the organic material layer or the carrier transport layer respectively provided for the light-emitting elements 140 that provide the distinct lights (for example, red and green) may be identical. After the light-emitting element is formed, the second electrode layer 160 may be formed on the light-emitting element 140 such that the second electrode layer 160 covers the light-emitting element 140. After this stage, when a bias voltage is applied to the light-emitting element 140 through the first electrode layer 120 and the second electrode layer 160, the light-emitting element 140 can be caused to generate electroluminescence.

Figure 3A:
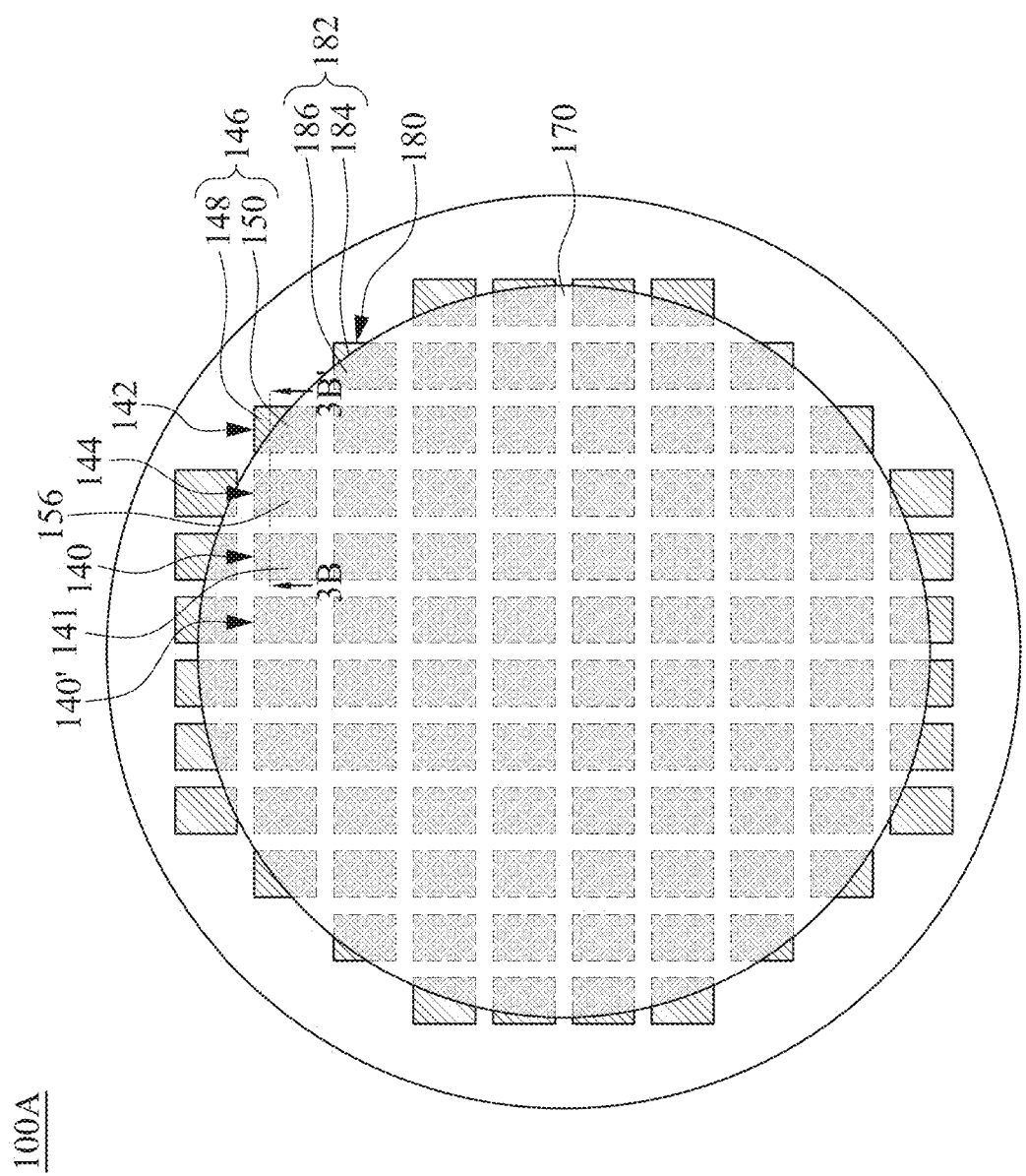
FIG. 3A is a top view showing the manufacturing method of the display panel in the manufacturing stage according to the first embodiment of the present disclosure.
Figure 3B:
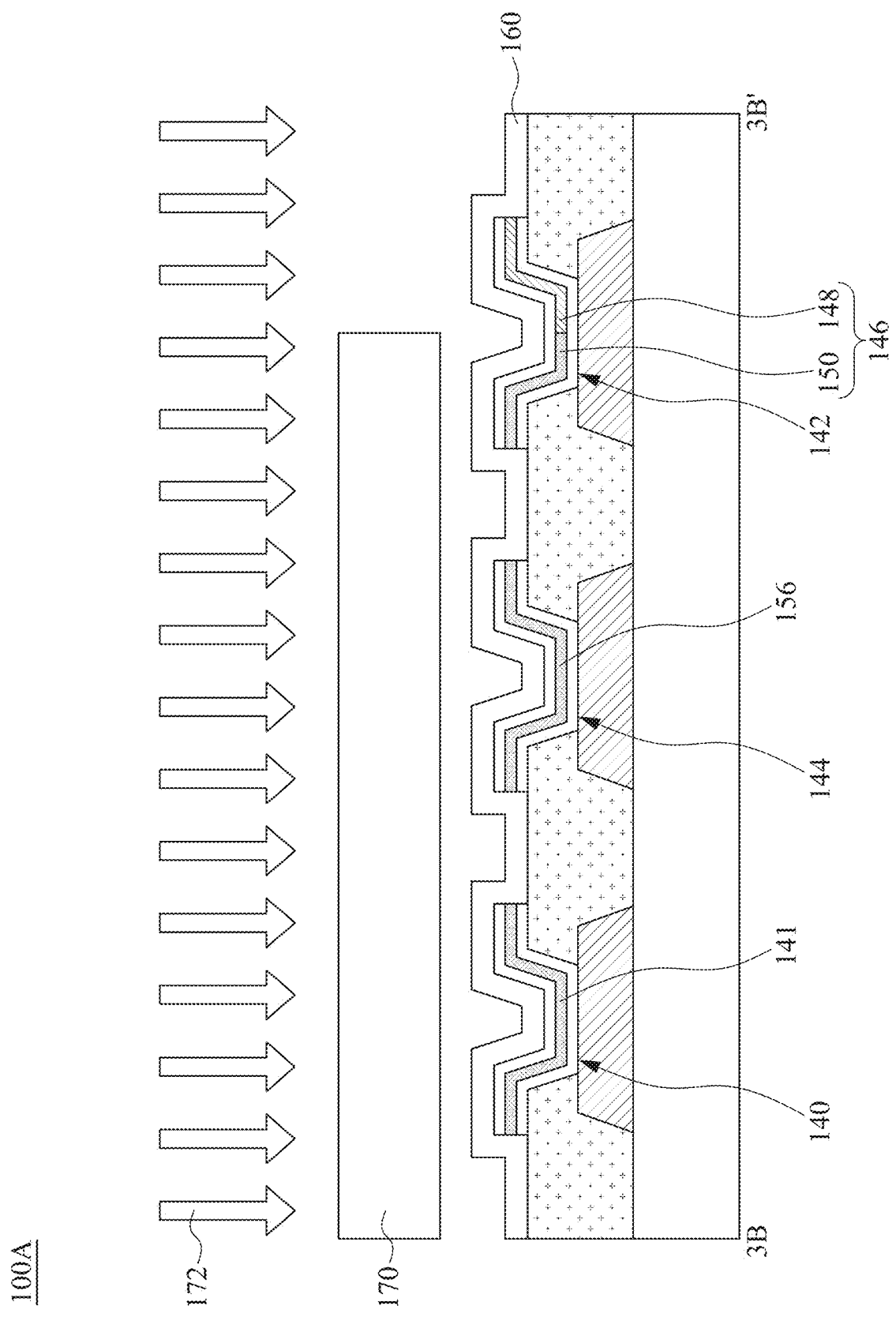
FIG. 3B is a schematic cross-sectional view of the line segment 3B-3B' of FIG. 3A.

Refer to FIGS. 3A and 3B, FIG. 3A is a top view showing the manufacturing method of the display panel 100A in the manufacturing stage according to the first embodiment of the present disclosure, and FIG. 3B is a schematic cross-sectional view of the line segment 3B-3B' of FIG. 3A. The manufacturing phase of FIG. 3A continues after the manufacturing phase of FIG. 2A. As shown in FIGS. 3A and 3B, a mask 170 having a circular shape and having an arc boundary contour may be disposed on the second electrode layer 160. In some other embodiments, a protective layer may be formed on the second electrode layer 160, and then the mask 170 may be disposed on the protective layer.

After disposing the mask 170, a portion of the light-emitting element 140 may be completely shielded by the mask 170, while another portion of the light-emitting element 140 are partially shielded by the mask 170, and thus a portion of the area may be exposed. For example, a portion of the first organic material layer 146 of the first light-emitting element 142 is shielded by the mask 170, while another portion of the first organic material layer 146 of the first light-emitting element 142 is not shielded by the mask 170 and thus is exposed. In addition, the second organic material layer 156 of the second light-emitting element 144 is completely shielded by the mask 170.

Next, the display panel 100A can be irradiated with ultraviolet light 172 to perform a modification process. During the illumination of the ultraviolet light 172, the ultraviolet light 172 illuminates the mask 170 and the portion of the organic material layer that is not shielded and exposed by the mask 170. For example, the portion of the first organic material layer 146 of the first light-emitting element 142 that is not shielded by the mask 170 is exposed to ultraviolet light 172.

For organic materials that are exposed to ultraviolet light 172, ultraviolet light 172 irradiation may cause photochemical reactions of organic molecules, such as fragmentation, dimerization, photo-oxidation, where the photooxidation may in turn lead to exciton quenching. That is, there is a difference between the organic material irradiated by the ultraviolet light 172 and the organic material not irradiated by the ultraviolet light 172, wherein the difference may be a difference in energy gap, impedance or carrier mobility, so that the organic material irradiated by the ultraviolet light 172 and the organic material not irradiated by the ultraviolet light 172 exhibit different luminescence performances at the same bias voltage. For example, a portion of the first organic material layer 146 of the first light-emitting element 142 that is irradiated by the ultraviolet light 172 may become the first portion 148 described above, and the first organic material layer 146 of the first light-emitting element 142 that is not irradiated by the ultraviolet light is the second portion 150 described above, wherein the first portion 148 and the second portion 150 exhibit different luminescence performances at the same bias voltage. In other words, through the modification process, the brightness provided by the first portion 148 when biased can be made less than the brightness provided by the second portion 150 when biased. Alternatively, the second portion 150 may emit light and the first portion 148 may not emit light under the same bias voltage. After the manufacturing stage is finished, the mask 170 can be removed to obtain the structure as shown in FIG. 1A.

On the other hand, after irradiating the ultraviolet light 172, the boundary position of the display region 102 (see FIG. 1A) can be defined by "the interface between the normal light-emitting portion and the abnormal light-emitting portion in the organic material layer," and the defined display region has the same shape as the mask 170. That is, since the organic material shielded by the mask 170 can normally emit light when biased, the shape of the display region is correspondingly the shape of the mask 170. In the case where the mask 170 used in FIG. 3A is circular and has an arc boundary contour, the defined display region will also be the same circular shape and the same arc boundary contour as the mask 170. In some other embodiments, other patterned masks, such as a pattern with curved or arc boundaries (or masks with distinct boundary contours), may be used to define the display region 102 (see FIG. 1A) as having a curved boundary or an arc boundary.

In addition, since the defined non-rectangular display region 102 (see FIG. 1A) is formed by the mask 170 and the ultraviolet light 172 irradiation, the light-emitting elements 140 at the boundary and inside the boundary of the display region (see FIG. 1A) may exhibit better uniformity. For example, for the first light-emitting element 142 and the light-emitting element 140' that provide the same color light (for example, red), the first light-emitting element 142 and the light-emitting element 140' are simultaneously formed at the same manufacturing stage, the manufacturing process parameters thereof are substantially the same and thus the illuminating performance are the same, thereby preventing the display panel 100A from having a non-uniform brightness condition.

Please refer to FIG. 3A. According to the foregoing, for the organic material layer 141 partially shielded by the mask 170, it may coincide with the boundary contour of the different positions of the mask 170. For example, the third light-emitting element 180 of the display panel 100A is adjacent to the first light-emitting element 142 and is separated from the first light-emitting element 142 by the pixel definition layer 130. The third light-emitting element 180 includes a portion of the third organic material layer 182 that is exposed to ultraviolet light 172 (see FIG. 3B) to form a third portion 184 and a fourth portion 186 that are connected to each other. In the stage of irradiating by ultraviolet light 172 (see FIG. 3B), the third portion 184 of the third organic material layer 182 is irradiated by ultraviolet light 172 (see FIG. 3B), while the fourth portion 186 is not irradiated by ultraviolet light 172 (see FIG. 3B). Therefore, when the third organic material layer 182 is biased, the luminance of the third portion 184 may be smaller than that of the fourth portion 186. This mechanism may be similar to the first organic material layer 146, and the details thereof are not described herein again.

The interface between the first portion 148 and the second portion 150 of the first organic material layer 146 may overlap with the boundary contour of the mask 170 at one location, while the interface between the third portion 184 and the fourth portion of the third organic material layer 182 will overlap the boundary contour of the other portion of the mask 170 at another location. That is, in the case where the mask 170 is circular, the interface between the first portion 148 and the second portion 150 of the first organic material layer 146 and the interface between the third portion 184 and the fourth portion 186 of the third organic material layer 182 overlap the boundary contour of the circle at different locations. In some other embodiments, the mask 170 can be other patterns, such as ovals, triangles, or polygons having more than four edges, and the interfaces described above still overlap the boundary contour of the patterns at different locations.

That is, the extension line of the boundary line connecting the first portion 148 and the second portion 150 of the first organic material layer 146 coincides with the extension line of the boundary line connecting the third portion 184 and the fourth portion 186 of the third organic material layer 182. "The extension line of the boundary line" refers to the extension according to the rule of the contour change of the pattern. For example, when the boundary line connecting the first portion 148 and the second portion 150 of the first organic material layer 146 and the boundary line connecting the third portion 184 and the fourth portion 186 of the third organic material layer 182 are line segments in the same direction, their extension lines will be two lines that coincide. When the boundary line connecting the first portion 148 and the second portion 150 of the first organic material layer 146 and the boundary line connecting the third portion 184 and the fourth portion 186 of the third organic material layer 182 are line segments of the same circle, their extension lines will be two arcs with the same curvature.

Figure 4:
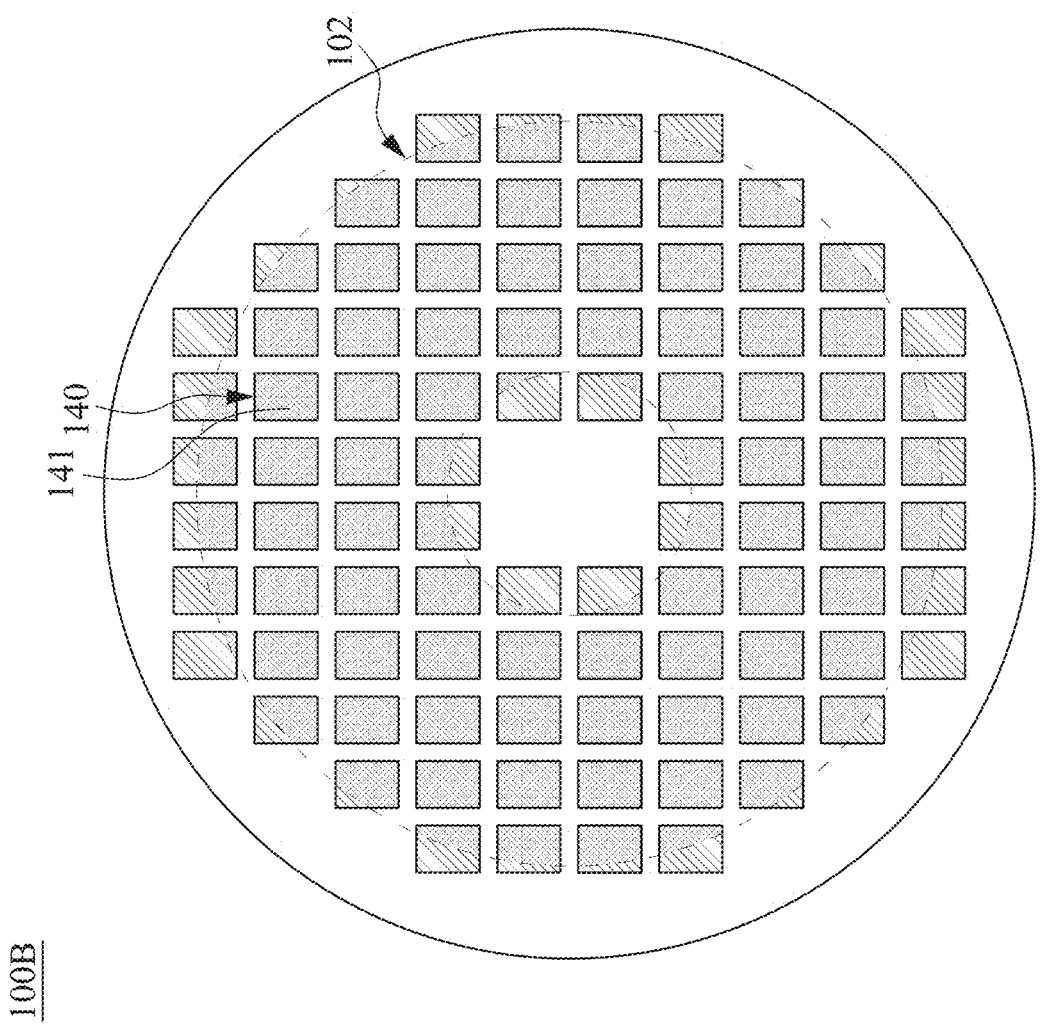
FIG. 4 is a schematic top view showing a display panel according to a second embodiment of the present disclosure.

Reference is made to FIG. 4 again, which is a schematic top view of the display panel 100B according to the second embodiment of the present disclosure. At least one difference between the present embodiment and the first embodiment is that the display region 102 of the display panel 100B of the present embodiment has a ring shape. Further, the outer edge boundary and the inner edge boundary of the display region 102 of the display panel 100B are concentric circles. In the manufacturing stage of the display panel 100B of the present embodiment, the light-emitting element 140 formed in the central region may be omitted. Also, in the stage of ultraviolet light irradiation, the mask may have a ring shape, so that the defined display region 102 will be the same ring shape as the mask. Therefore, in addition to that the light-emitting elements 140 arranged in the outermost side of the light-emitting element array may be "partially illuminable (for example, the second portion 150 of the first embodiment) and the other portion may not emit light (for example, the first portion 148 of the first embodiment)," the light-emitting elements 140 arranged at the innermost side of the light-emitting element array (i.e., the light-emitting elements 140 closest to the central region) may also be "partially illuminable and the other portion being unable to emit light."

It should be understood that the shape of the display region of the display panel of the present disclosure is not limited to the above embodiment. In other embodiments, the display area of other non-rectangular patterns may be formed by changing the shape of the mask. Furthermore, the outer edge boundary and the inner edge boundary of the display region may be different patterns, for example, the outer edge boundary and the inner edge boundary may be elliptical and circular, respectively.

Figure 5:
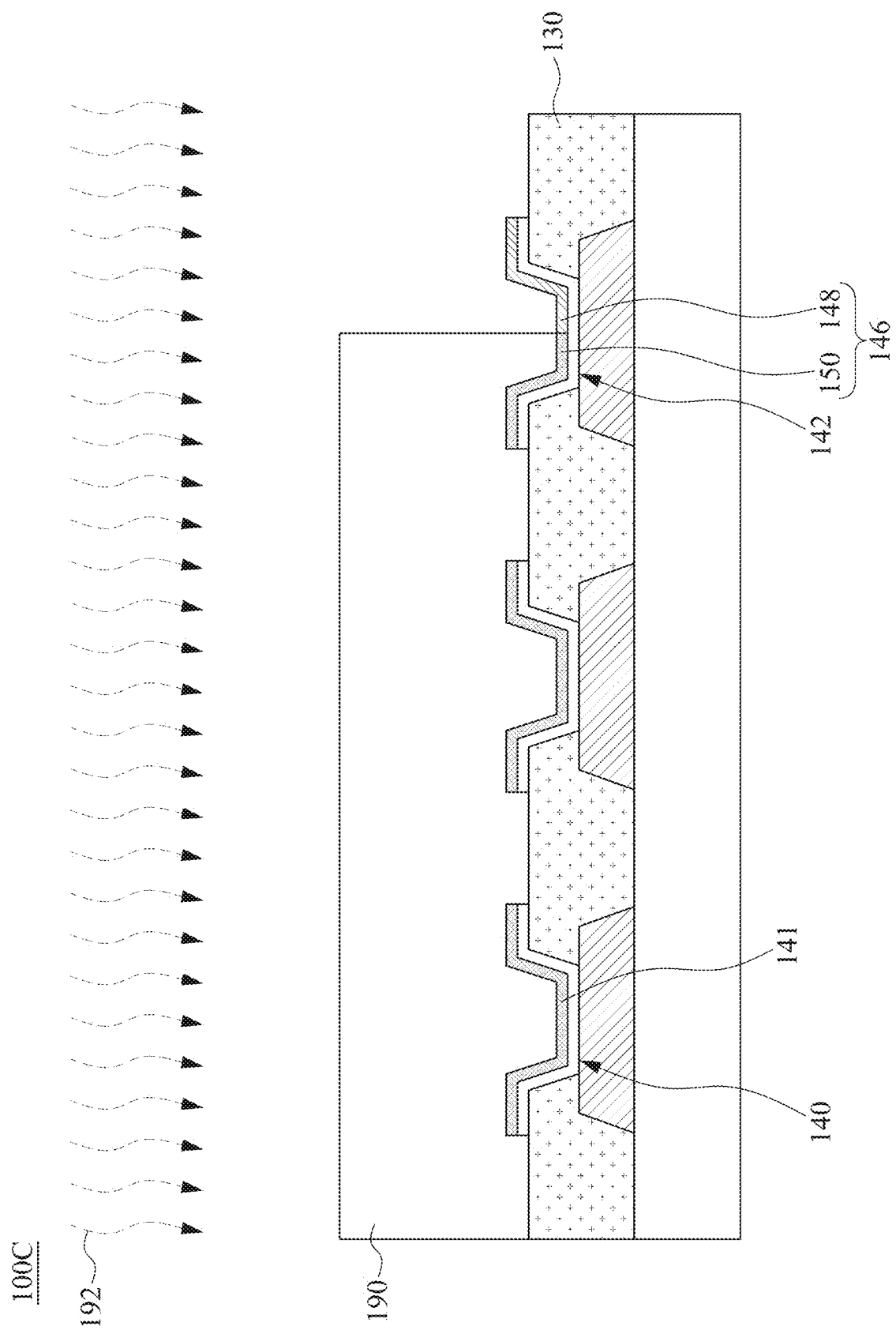
FIG. 5 is a top view showing the manufacturing method of the display panel in the manufacturing stage according to the third embodiment of the present disclosure.

The above embodiments achieve the modification effect by irradiating ultraviolet light. However, the present disclosure is not limited thereto. FIG. 5 is a cross-sectional view showing the manufacturing method of the display panel 100C in the manufacturing stage according to the third embodiment of the present disclosure. The cross-sectional position of FIG. 5 corresponds to that of FIG. 3B.

As shown in FIG. 5, after forming the organic material layer 141 of the light-emitting element 140, the mask 190 is first disposed on the display panel 100C, and a portion of the organic material layer 141 is completely shielded by the mask 190. Another portion of the organic material layer 141 is partially shielded by the mask 190, and thus a portion of the organic material layer 141 is exposed. In this embodiment, the mask 190 may be a protective layer formed on the pixel definition layer 130 and the organic material layer 141, wherein the material of the protective layer may be an organic material or an inorganic material, such as an epoxy resin, a cerium oxide (SiOx), tantalum nitride (SiNx), a composite layer composed of tantalum oxide and tantalum nitride or other suitable dielectric material.

Then, the display panel 100C and the mask 190 thereon are placed in a high-humidity environment, so that the organic material layer 141 not covered by the mask 190 is modified by water and oxygen in the environment. For example, the water-oxygen environment 192 may undergo an oxidation reaction with the organic material layer 141, wherein the oxidation reaction involves a photochemical reaction and an electrochemical reaction, so that the material properties of the organic material layer 141 not covered by the mask 190 are different from those of the organic material layer 141 covered by the mask 190. Therefore, a part of the light-emitting element 140 can be formed to have a normal light-emitting portion and an abnormal light-emitting portion by the water-oxygen environment 192. For example, the first light-emitting element 142 can be configured to form the first organic material layer 146 to have the first portion 148 and the second portion 150 as described above.

Figure 6:
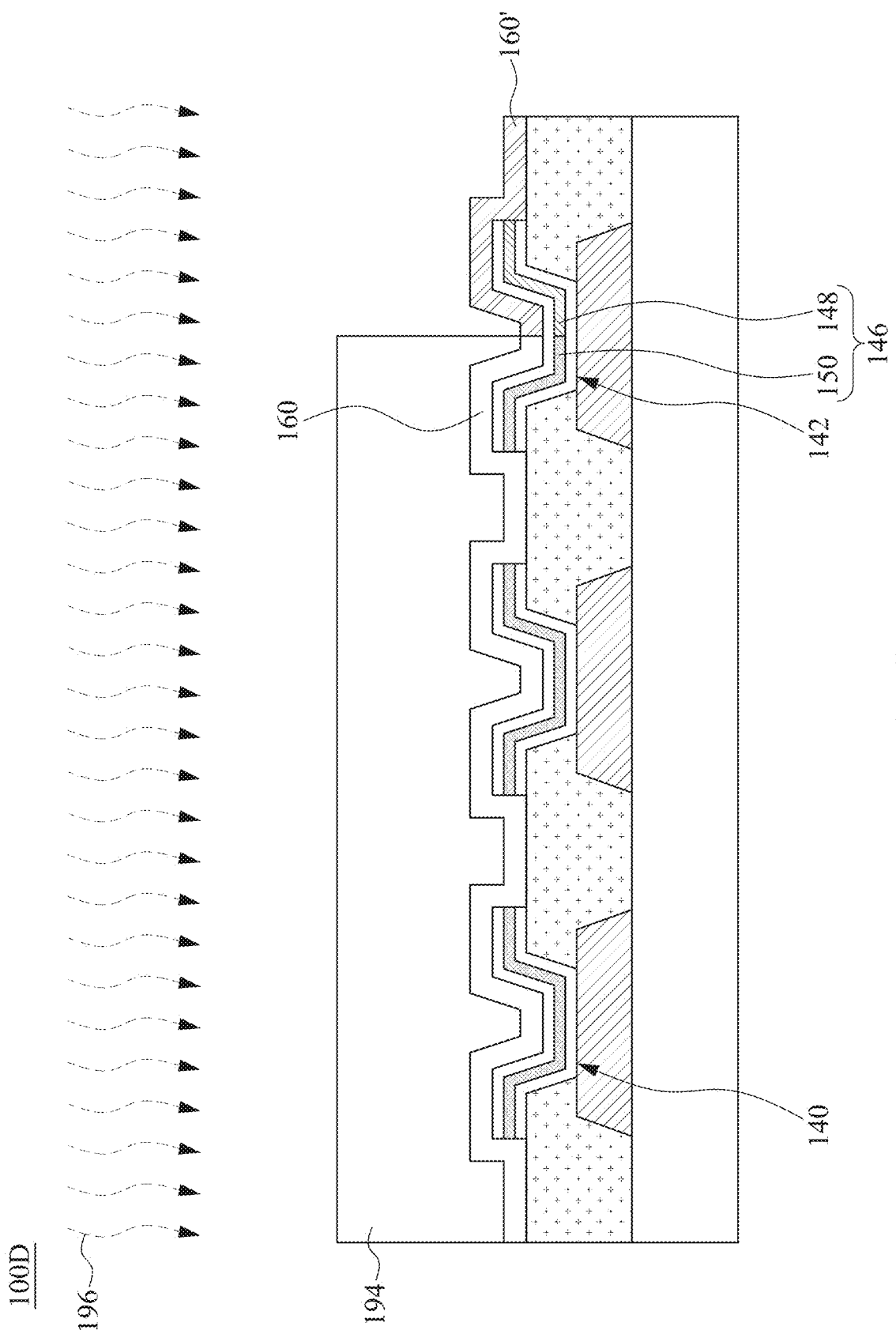
FIG. 6 is a top view showing the manufacturing method of the display panel in the manufacturing stage according to the fourth embodiment of the present disclosure.

FIG. 6 is a cross-sectional view showing the manufacturing method of the display panel 100C in the manufacturing stage according to the fourth embodiment of the present disclosure. The cross-sectional position of FIG. 6 corresponds to that of FIG. 3B. At least one difference between the present embodiment and the third embodiment is that in the present embodiment, after the second electrode layer 160 is formed, the mask 194 is further provided on the display panel 100D. A portion of the second electrode layer 160 may be completely shielded by the mask 194, while another portion of the second electrode layer 160 is partially shielded by the mask 194, and thus a portion of the second electrode layer 160 is exposed, as indicated by the labeled second electrode layer 160'.

Then, the display panel 100D and the mask 194 thereon are placed in a high-humidity environment, thereby chemically reacting the exposed second electrode layer 160' by the water-oxygen environment 196, thereby oxidizing the metal and generating hydrolyzed derivatives. The generated hydrolyzed derivative may further react with the inner layer of the lower light-emitting element 140 and cause crystal deformation, thereby forming the part of the light-emitting element 140 to have the normal light-emitting portion and the abnormal light-emitting portion, for example, the first organic material layer 146 of the first light-emitting element 142 can be formed into the aforementioned first portion 148 and second portion 150 by this mechanism.

In summary, the display panel of the present disclosure includes a plurality of light-emitting elements, wherein the light-emitting elements can be arranged in an array to define a display region of the display panel. The organic material layer of the light-emitting element positioned at the outermost side of the array may be formed to have a portion that can normally emit light and a portion that cannot emit light normally, and the interface between the portion that can normally emit light and the portion that cannot normally emit light is the boundary of the display region. In the organic material layer of the light-emitting element at the outermost side of the array, the interface between the portion that can normally emit light and the portion that cannot normally emit light may be curved or arch, such that the display region of the display panel is a non-rectangular pattern. That is, the display panel may present a non-rectangular display region without using additional shields. Since the shield is not used, the layer configuration of the surface of the display panel can be facilitated. On the other hand, since the non-rectangular display region is realized by modifying the organic material layer of the light-emitting element, the light-emitting element can be formed under the same conditions at the same manufacturing stage, thereby preventing the display panel from having non-uniform brightness.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations may be made to the structure of the present invention without departing from the scope or spirit of the invention. In view of the foregoing, it is intended that the present disclosure cover modifications and variations of this disclosure provided they fall within the scope of the following claims.

What is claimed is:

1. A display panel having a non-rectangular display surface, comprising:
  a substrate;
  a pixel definition layer disposed on the substrate, and defining a first pixel area and a second pixel area on the substrate;
  a first organic material layer disposed in the first pixel area and having a first light-emitting region, wherein the first organic material layer comprises a first portion and a second portion, the second portion corresponds to the first light-emitting region, wherein the first portion has a first set of material properties including a first minimum turn-on voltage, a first energy gap, a first impedance, and a first carrier mobility, the second portion has a second set of material properties including a second minimum turn-on voltage, a second energy gap, a second impedance, and a second carrier mobility, and at least one of the first set of material properties of the first portion is different from the second set of the material properties of the second portion; and a second organic material layer disposed in the second pixel area and having a second light-emitting region, wherein the second organic material layer and the second portion of the first organic material layer comprise the same material, and a vertical projection area of the first light-emitting region on the substrate is smaller than a vertical projection area of the second light-emitting region on the substrate.

2. The display panel of claim 1, wherein the first organic material layer and the second organic material layer have substantially the same thickness.

3. The display panel of claim 1, further comprising:

a plurality of carrier transport layers stacked with the first organic material layer and the second organic material layer in the first pixel area and the second pixel area, respectively.

4. The display panel of claim 1, wherein a vertical projection position of the first organic material layer on the substrate is adjacent to an edge of the substrate with respect to a vertical projection position of the second organic material layer on the substrate.

5. The display panel of claim 1, wherein a portion of a boundary contour of the first light-emitting region of the first organic material layer coincides with a portion of a boundary contour of a display region of the non-rectangular display surface.

6. The display panel of claim 1, wherein the first portion and the second portion of the first organic material layer are connected to each other, and a ratio of the minimum turn-on voltage of the first portion to the minimum turn-on voltage of the second portion is between 2 and 7.

7. The display panel of claim 1, further comprising:

a plurality of driving electrodes disposed between the substrate and the first organic material layer and between the substrate and the second organic material layer such that an illuminating intensity of each of the first pixel area and the second pixel area is independently controlled by the plurality of driving electrodes.

8. The display panel of claim 7, wherein the first pixel area is located at an edge of a display region of the display panel, and the second pixel area is located distant from the edge with respect to the first pixel area.

9. The display panel of claim 7, wherein the first pixel area and the second pixel area are used to emit the same color light.

10. The display panel of claim 7, wherein a ratio of the first light-emitting region to an illuminating area of the second light-emitting region is greater than 0 and less than or equal to 0.95.

11. The display panel of claim 7, wherein the first portion and the second portion of the first organic material layer are connected to each other.

12. The display panel of claim 11, wherein the first portion of the first organic material layer is modified by irradiating the first portion of the first organic material layer with ultraviolet light or exposing the first portion of the first organic material layer with water and oxygen.

13. The display panel of claim 11, wherein the first portion of the first organic material layer is modified while leaving the second portion of the first organic material layer shielded by a mask.

14. The display panel of claim 7, wherein the second organic material layer has a first segment on the driving electrode, a second segment on a sidewall of the pixel definition layer, and a third segment on a top surface of the pixel definition layer.

15. The display panel of claim 1, further comprising:

a common electrode extending over the pixel definition layer, the first organic material layer, and the second organic material layer.

16. The display panel of claim 15, wherein the common electrode is directly in contact with a top surface of the pixel definition layer.

17. The display panel of claim 15, wherein the second organic material layer is separated from the first organic material layer by the pixel definition layer and the common electrode.

* * * * *